United States Patent
Sakaguchi

(10) Patent No.: US 6,906,456 B2
(45) Date of Patent: Jun. 14, 2005

(54) ORGANIC EL PANEL HAVING PARTITIONS SEPARATING PIXELS

(75) Inventor: Yoshikazu Sakaguchi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 64 days.

(21) Appl. No.: 10/319,991

(22) Filed: Dec. 16, 2002

(65) Prior Publication Data

US 2003/0124245 A1 Jul. 3, 2003

Related U.S. Application Data

(62) Division of application No. 09/592,522, filed on Jun. 12, 2000, now Pat. No. 6,520,819.

(30) Foreign Application Priority Data

Jun. 16, 1999 (JP) ............................................ 11-169889

(51) Int. Cl.[7] .............................................. H05B 33/10
(52) U.S. Cl. ........................ 313/504; 313/500; 313/503; 313/505; 313/506; 445/24; 427/66; 427/68
(58) Field of Search ................................. 313/504–506; 445/24; 427/66, 68

(56) References Cited

U.S. PATENT DOCUMENTS

| | | | | |
|---|---|---|---|---|
| 5,585,213 A | * | 12/1996 | Tamano et al. ............. | 313/504 |
| 5,681,664 A | * | 10/1997 | Tamano et al. ............. | 428/690 |
| 5,804,917 A | * | 9/1998 | Takahashi et al. .......... | 313/504 |
| 5,968,675 A | * | 10/1999 | Tamano et al. ............. | 313/504 |
| 6,326,726 B1 | | 12/2001 | Mizutani et al. ............ | 313/504 |
| 6,592,933 B2 | * | 7/2003 | Himeshima et al. .......... | 427/66 |

FOREIGN PATENT DOCUMENTS

| | | | | |
|---|---|---|---|---|
| JP | 04-067596 | | 3/1992 | ........... H05B/33/14 |
| JP | 04-320483 | | 11/1992 | ........... C09K/11/00 |
| JP | 07-106066 | | 4/1995 | ........... H05B/33/22 |
| JP | 08-202287 | | 8/1996 | ............. G09F/9/30 |
| JP | 8-315981 | | 11/1996 | ........... H05B/33/10 |
| JP | 9-102393 | | 4/1997 | ........... H05B/33/06 |
| JP | 10-241859 | | 9/1998 | ........... H05B/33/22 |
| JP | 11126687 A | * | 5/1999 | ........... H05B/33/10 |
| JP | 11-126687 | | 5/1999 | ........... H05B/33/10 |

\* cited by examiner

*Primary Examiner*—Vip Patel
*Assistant Examiner*—Sikha Roy
(74) *Attorney, Agent, or Firm*—McGuireWoods LLP

(57) ABSTRACT

For an organic EL panel, whereon partitions are used to separate pixels, transparent electrodes, a charge generation layer and a charge transfer layer are formed in the named order on a substrate. Then, when the charge transfer layer is electrified and the charge generation layer is selectively exposed, an electrostatic latent image having a predetermined pattern is formed on the charge transfer layer. Subsequently, to form the partitions, the electrostatic latent image is developed by using a developing agent and the developing agent is fixed. Following this, emission layers and opposing electrodes to the transparent electrodes are positioned between the thus obtained partitions.

4 Claims, 11 Drawing Sheets

ORGANIC EL PANEL HAVING PARTITIONS SEPARATING PIXELS

The present Application is a divisional Application of prior U.S. application Ser. No. 09/592,522 filed Jun. 12, 2000 now U.S. Pat. No. 6,520,819

BACKGROUND OF THE INVENTION

1. Field of the Invention

The present invention relates to an organic electroluminescence (hereinafter referred to as EL) panel and a method of manufacturing the same, and more particularly to an organic EL panel provided with partitions for separating pixels and to a method of manufacturing the partitions.

2. Related Arts

An organic EL panel having such partitions is disclosed in Japanese Unexamined Patent Publications No. Hei 9-102393 and Hei 8-315981. According to the organic EL panel manufacturing method disclosed in these publications, as is shown in FIG. 1A, anodes, transparent electrodes 2 composed of indium tin oxide (hereinafter referred to as ITO), are formed as stripes on a transparent substrate 1, and to separate the pixels, photolithography is used to form electrical insulating partitions 31 that cross and that are perpendicular relative to the transparent electrodes 2. The lower portions of these partitions 31 are tapered invertedly, and their upper portions constitute overhanging portions 310. Then, as is shown in FIG. 1B, using a film deposition mask 37, an organic emission material that emits only one color is deposited on the transparent substrate 1, on which the partitions 31 are formed, at angles indicated by arrows P and Q, so that the organic emission material extends outward to either side and under the overhanging portions 310. This deposition process is repeated for each color to obtain an organic emission layers 32. Thereafter, as is shown in FIG. 1C, to form cathode electrodes 33 on the partitions 31 and the emission layers 32, the film deposition mask 37 is removed and a cathode electrode material is deposited in the direction, as is indicated by arrows S, that is substantially perpendicular to the transparent substrate 1. Since each partition 31 has overhanging portions 310, the cathode electrode 33 on each side of a partition 31 is electrically insulated.

As is shown in FIGS. 1A to 1C, the partitions 31, which are obtained by using a resist to provide an invertedly tapered shape, are employed to separate pixels and cathodes. When a resist is employed, however, the resist's residual developing liquid, an etching liquid and a small quantity of water act together to cause deterioration of the interfaces of the organic emission layer 32 and the cathode electrodes 33. As a result, a non-emission point called a dark spot is generated. The generation of a dark spot makes it difficult to extend the service life of a panel. The overhanging portions 310 of the invertedly tapered partitions 31 are formed by using a difference in the developing speeds that is the result of differences in the light exposure volumes in the direction of thickness. Thus, the sizes of overhanging portions 310 are unstable and insufficient separations tend to occur. When an insufficient separation occurs, not only are a cathode electrode 33 and an anode, transparent electrode 2 short-circuited and a non-emission element generated, but also the panel may be damaged by heat due to the short circuit. In addition, for such a display panel, the partitions 31 must have, at the least, a predetermined width in order to prevent insufficient separation, so that the area required for the partitions 31, which serve as non-light emission portions, is increased. As a result, the aperture ratio can not be increased, and it is difficult to attain a smaller pixel size.

SUMMARY OF THE INVENTION

It is, therefore, one objective of the present invention to provide an organic EL panel for which a smaller pixel size can be attained and for which productivity can be enhanced, and a manufacturing method thereof.

It is another objective of the present invention to provide an organic EL panel that is obtained as an apparatus having a smaller feature size and high image quality, and a manufacturing method thereof.

To achieve these objectives, the present inventors have devoted their time and effort to developing methods by which to acquire a smaller feature size for an organic EL panel and by which to improve productivity. As a result, the inventors were able to devise an effective method to use for forming partitions for separating pixels. According to this method, after a charge generation layer and a charge transfer layer have been formed on a transparent electrode, an electric charge is applied to the charge transfer layer and the charge generation layer is selectively exposed to form on it an electrostatic latent image having a predetermined pattern. Then, a developing agent is used to develop the electrostatic latent image, and the developed image is fixed, forming partitions. After the inventors developed this idea, they applied it in the fabrication of an organic EL panel and in the development of a manufacturing method in accordance with the present invention.

Specifically, according to one aspect of the present invention, a method for manufacturing an organic EL panel comprises the steps of:

forming on a transparent substrate a first electrode that is made of a transparent material;

forming a charge generation layer and a charge transfer layer, in the named order, on the first electrode;

charging the charge transfer layer, and then selectively exposing the charge generation layer so as to form, on the charge transfer layer, an electrostatic latent image having a predetermined pattern;

forming, on the charge transfer layer, a developing agent pattern that corresponds to the electrostatic latent image;

forming the developing agent pattern as partitions for separating pixels; and forming an emission layer and a second electrode between the partitions.

Since with this method the generation and growth of dark spots can be prevented, productivity can be improved.

The method of the present invention, for manufacturing an organic EL panel, includes a manufacturing method whereby, after a mask having a predetermined pattern that leaves at least a part of the charge transfer layer exposed is mounted on the partitions, the emission layer and the second electrode are formed by vacuum deposition, or whereby the emission layer and the second electrode are formed by oblique deposition.

The developing agent used in the method of the present invention for manufacturing an organic EL panel is a mixture of a charge control agent and at least one material selected from among polyester, acryl and styrene-acrylic copolymer. Furthermore, the developing agent may contain a black material to form black partitions. The developing agent may further contains a magnetic powder.

According to another aspect of the present invention, a method for manufacturing an organic EL panel comprises the steps of:

forming on a transparent substrate a first electrode that is composed of a transparent material;

forming a charge generation layer and a charge transfer layer, in the named order, on the first electrode;

charging the charge transfer layer;

selectively exposing a predetermined area of the charge generation layer so as to form, on the charge transfer layer, an electrostatic latent image having a predetermined pattern;

developing the electrostatic latent image to form a developing agent pattern;

fixing the developing agent pattern to the charge transfer layer to form partitions; and forming an emission layer and a second electrode, in the named order, between the partitions.

In addition, according to an additional aspect of the present invention, an organic EL panel comprises:

a transparent substrate;

a first electrode, composed of a transparent material, that is formed on the transparent substrate;

a charge generation layer covering the first electrode;

a charge transfer layer formed thereon;

partitions formed on the charge transfer layer by using a developing agent pattern having a predetermined shape; and an emission layer and a second electrode formed between the partitions.

The organic EL panel of the present invention includes following features that the width of each of the partitions is 10 to 40 μm and the partitions are black.

DETAILED DESCRIPTION OF THE PREFERRED EMBODIMENTS

Figure 2:
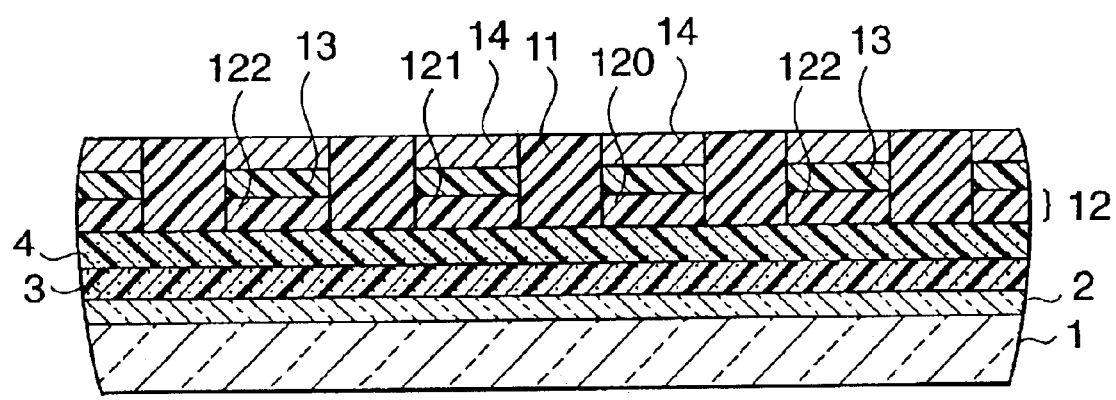
FIG. 2 is a cross-sectional view of an organic EL panel according to the present invention.

For an organic EL panel according to the present invention, as is shown in FIG. 2, a transparent anode electrode 2, composed of indium tin oxide (ITO) or of tin oxide thin film, is formed on a transparent substrate 1, such as a glass substrate, and a charge generation layer 3 and a charge transfer layer 4 are formed on the anode electrode 2. Then a plurality of parallel partitions 11 are formed on the charge transfer layer 4. After that, emission layers 12 are formed between the individual partitions 11, then electron transport layers 13 and cathode electrodes 14 are formed successively on the emission layers 12. That is, the anode electrode 2 and the cathode electrodes 14 are opposed to each other such that the charge generation layer 3, the charge transfer layer 4, the emission layers 12 and the electron transport layers 13 are sandwiched therebetween. The emission layers 12 are formed of red emission layers 120, green emission layers 121 and blue emission layers 122.

In FIG. 2 the organic EL panel is formed by using three colors; however, the organic EL panel may be formed as a single-color panel, and in this case, the emission layers 12 are prepared by using only the pertinent color.

The charge generation layer 3 and the charge transfer layer 4 are composed of an organic resin, and the charge generation layer 3 serves as a photosensitive layer. The charge generation layer 3 is formed by using a coating liquid that is obtained by dispersing in a butyral resin, metal-free material, copper or a phthalocyanine compound such as titanyl or vanadyl, or a perylene-based coloring matter, a polycyclic quinone-based coloring matter, a squallium coloring matter, or an azulenium coloring matter. The charge transfer layer 4 is formed by using a coating liquid that is obtained by dispersing in a polycarbonate resin a diamine derivative, such as N,N'-diphenyl-N,N'-di(3-methylphenyl)-1,1'-biphenyl-4,4'-diamine (TPD), N,N'-diphenyl-N,N'-bis(α-naphthyl)-1,1'-biphenyl-4,4'-diamine (α-NPD), an arylamine-based compound, such as such as 4,4',4"-tris(3-methylphenyl phenylamino)-triphenylamin, a heterocyclic compound, such as oxadiazole, oxazole or pyrazoline, a hydrazone-based compound, or a condensed polycyclic compound.

The charge generation layer 3 and the charge transfer layer 4 are formed on the anode electrode 2 by dipping or by spin coating. It is preferable that the charge generation layer 3 and the charge transfer layer 4 be as thin as possible, while taking into account the mobility of a carrier and the construction in which light is extracted from the side of the substrate 1 of an organic EL panel. However, since dielectric breakdown due to pin holes will occur if these layers are too thin, a total thickness of the charge generation layer 3 and the charge transfer layer 4 is preferably 0.1 μm to 5 μm.

The partition 11 is formed of an insulating material, such as polyester, styrene-acrylic copolymer or acrylic resin. In addition, the black partitions 11 can be formed by kneading into the resin a magnetic powder such as magnetite or a ferrite, $Fe_3O_4$, $MnO.Fe_2O_3$ or $ZnO.Fe_2O_3$. Furthermore, instead of a magnetic powder, a tiny amount of a black material such as carbon black, furnace black, channel black, acetylene black or ketene black can be kneaded into the resin. When a black compound is thus used to prepare the partitions 11, the spacing portions that are formed between pixels, the display contrast can be enhanced.

The emission layer 12 is formed by using, as a host material, an 8-hydroxyquinoline metallic complex such as tris(8-quinolinol)aluminum, a distyryl benzene derivative such as 1,4-bis(2-methylstyryl)benzene, a bis styryl anthracene derivative, a coumarin derivative, or a perylene derivative. An emission layer 121 that emits green light is formed by depositing a host and a dopant, a quinacridone derivative such as quinacridone or 2,9-dimethylquinacridone, or a coumarin derivative such as 3-(2-benzothiazolyl)-7-diethylaminocoumarin (coumarin 540). A red emission layer 120 is formed by depositing a host and a dopant, a dicyanomethylene pyrane coloring matter such as 4-dicyanomethylene-2-methyl-6-(p-dimethylaminostyryl)-4H-pyrane (DCM) or 4-dicyanomethylene-2-methyl-6-[2-(9-julolidil)ethenyl]-4H-tiopyrane, a phenoxazone derivative, or a squallium coloring matter. And a blue emission layer 122 is formed by depositing a host and a dopant, a distyryl arylene derivative such as 4,4'-bis(2,2-diphenylvinyl)biphenyl, a distyryl benzen derivative, a tetraphenyl butadiene derivative such as tetraphenyl cyclopentadiene or pentaphenyl cyclopentadiene, or a perylene derivative.

The electron transport layer 13 is formed of a material wherein electrons are used as carriers, for example, an 8-hydroxyquinoline metallic complex such as tris(8-quinolinol)aluminum or bis(8-quinolinol)magnesium, an oxadiazole derivative, a perylene derivative. In this embodiment, to form the cathode electrodes 14 the alloy or co-deposition method is employed to perform vacuum deposition using Mg:Ag or Al:Li.

Figure 3A:
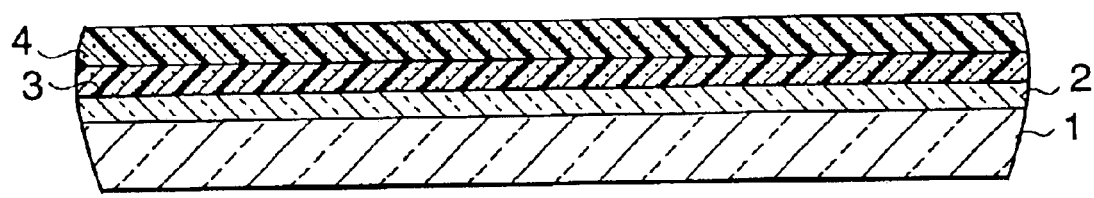
FIGS. 3A to 3H are cross-sectional views for explaining a method for manufacturing the organic EL panel according to the present invention.

The method employed to manufacture the organic EL panel of the present invention will now be described while referring to FIGS. 3 to 8. First, as is shown in FIG. 3A, the transparent electrodes 2, which are composed of a transparent material such as indium tin oxide (ITO) or tin oxide thin film, are deposited on the transparent substrate 1, composed, for example, of glass. A thin film deposition method, sputtering, electron beam or chemical reaction, is used for this. Subsequently, the charge generation layer (hole injection layer) 3 and the charge transfer layer (hole transport layer) 4 of organic material are formed on the transparent electrodes 2. The charge generation layer 3 is formed by applying a coating liquid that is prepared by dispersing the above described charge generation agent in a butyral resin. Thereafter, as is described above, the charge transfer layer 4 is formed by applying a coating liquid that is prepared by dispersing in a polycarbonate resin, a diamine derivative such as TPD or α-NPD, an arylamine-based compound such as such as 4,4',4"-tris(3-methylphenyl phenylamino)-triphenylamin, a heterocyclic compound such as oxadiazole, oxazole or pyrazoline, a hydrazone-based compound, or a condensed polycyclic compound. Either dipping or spin coating may be employed to form the charge generation layer 3 and the charge transfer layer 4. When the charge generation layer 3 and the charge transfer layer 4 are formed by employing a binder resin in which the hole injection transport material has been dispersed, the adhesion properties between the transparent electrode 2 and the organic layers (the charge generation layer 3 and the charge transfer layer 4) can be improved, and cohesion of the material and changes in the film quality do not occur. As a result, dielectric breakdowns or short-circuits due to the field concentration can be prevented, and the ability of the panel to resist heat can be increased and its service life can be extended.

Figure 3B:
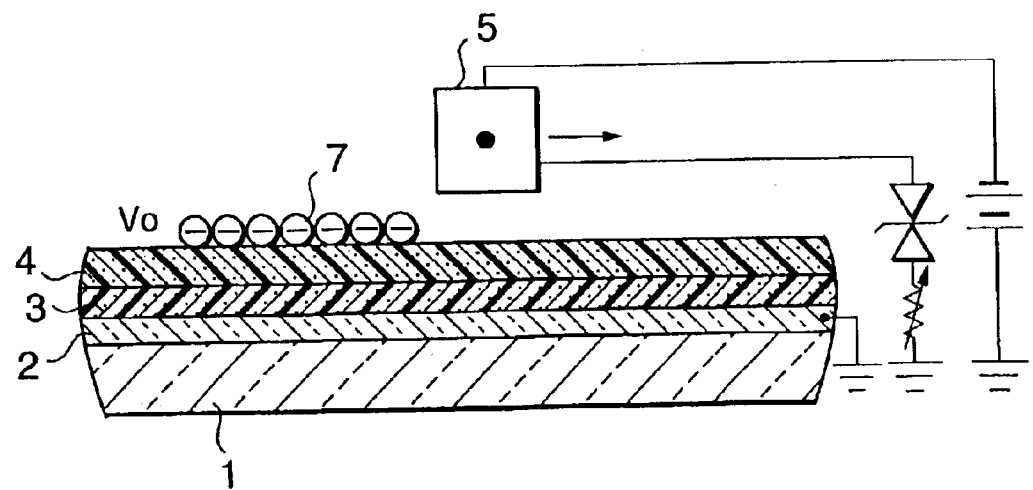
Figure 4:
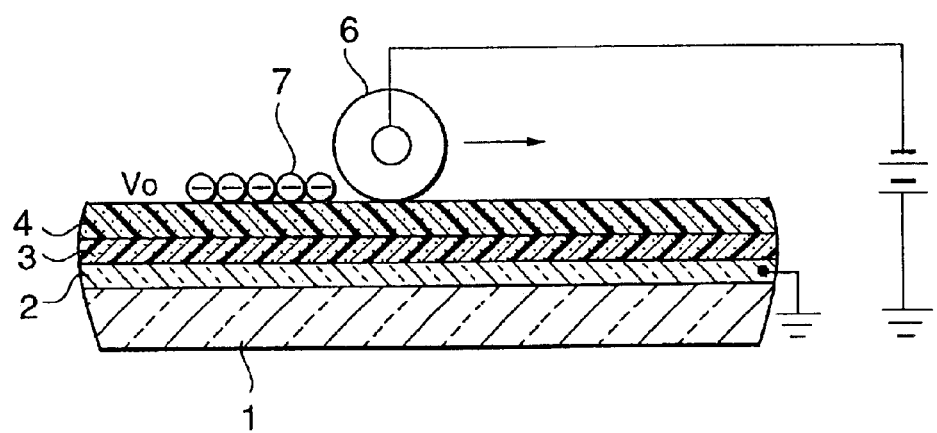
FIG. 4 is a cross-sectional view for explaining a replacement procedure for the one shown in FIG. 3B.

Next, as is shown in FIG. 3B, for the substrate on which the organic layer, consisting of the charge generation layer 3 and the charge transfer layer 4, is formed, a non-contact charger 5 employing a corona discharge, such as a scorotron, is used to apply a charge to the surface of the charge transfer layer 4. Instead of the non-contact charger 5, as is shown in FIG. 4, a contact charger 6 such as a brush, a blade or a roller charger may also be employed. The optimal charge potential Vo at the surface of the charge transfer layer 4 differs depending on the carrier mobility and the thickness of the charge generation layer 3, which is an organic photosensitive layer, and is approximately–300 to–1000 V when inversion development, for example, is performed. Through the above process, surface charges 7 are placed on the surface of the charge transfer layer 4.

Figure 3C:
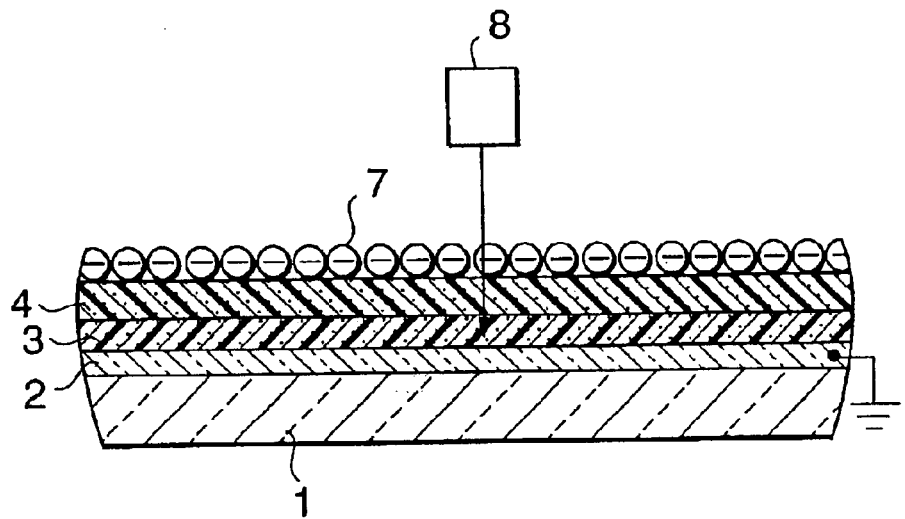

Then, as is shown in FIG. 3C, an exposure unit 8, which is a semiconductor laser or an LED, is employed to selectively expose those portions of the charge generation layer 3 that are to be used for the partitions 11, or a photomask that shields areas other than those to be used for the partitions 11 is employed to selectively expose portions of the charge generation layer 3. The exposure using the semiconductor laser is much more effective than the exposure for which the photomask is used because partitions having arbitrary shapes can be defined, and fine scanning can be performed. Then, as is shown in FIG. 3c, positive development is performed. For inverted development, portions of the charge generation layer 3 other than those that are to be used for the partitions 11 are selectively exposed, while for positive development, portions of the charge generation layer 3 that are to be used for the partitions 11 are selectively exposed. The wavelength of the light emitted by the exposure unit 8 is about 780 nm, which is the absorption wavelength for the charge generation layer 3. During positive development, as is shown in FIG. 3C, when the laser beam emitted by the exposure unit 8 reaches the charge generation layer 3, holes and electrons are generated in the charge generation layer 3, and the holes are injected into the charge transfer layer 4 by a field based on the surface potential of the charge transfer layer 4 (a potential Vo, which is generated by placing a charge on the surface of the charge transfer layer 4). As a result, the holes are transferred to the charge transfer layer 4 and extended outward until they reach its surface.

Figure 3D:
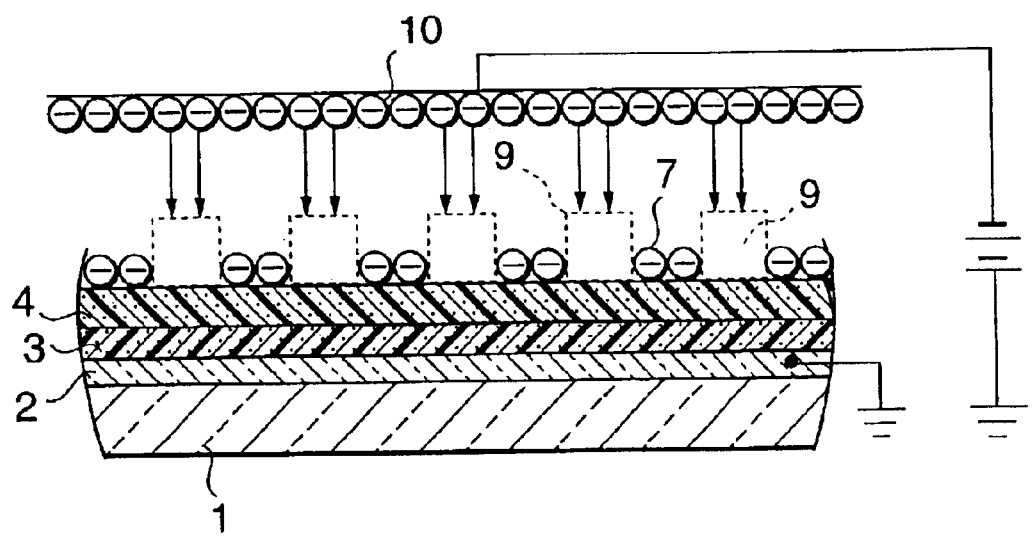

As is shown in FIG. 3D, in the portions irradiated by the emitted light, the surface charges 7 are eliminated when the holes that have reached the surface of the charge transfer layer 4 are coupled with the charges on the surface of the charge transfer layer 4. Then, an electrostatic latent image 9 is formed that has a latent image potential Vi and that has a predetermined pattern. The electrostatic latent image 9 is a charge having a latent image potential Vi and a predetermined pattern. For positive development, in a process that will be described later, the partitions 11 are formed in the areas on the charge transfer layer 4 whereat the surface charges 7 have been eliminated.

Figure 5:
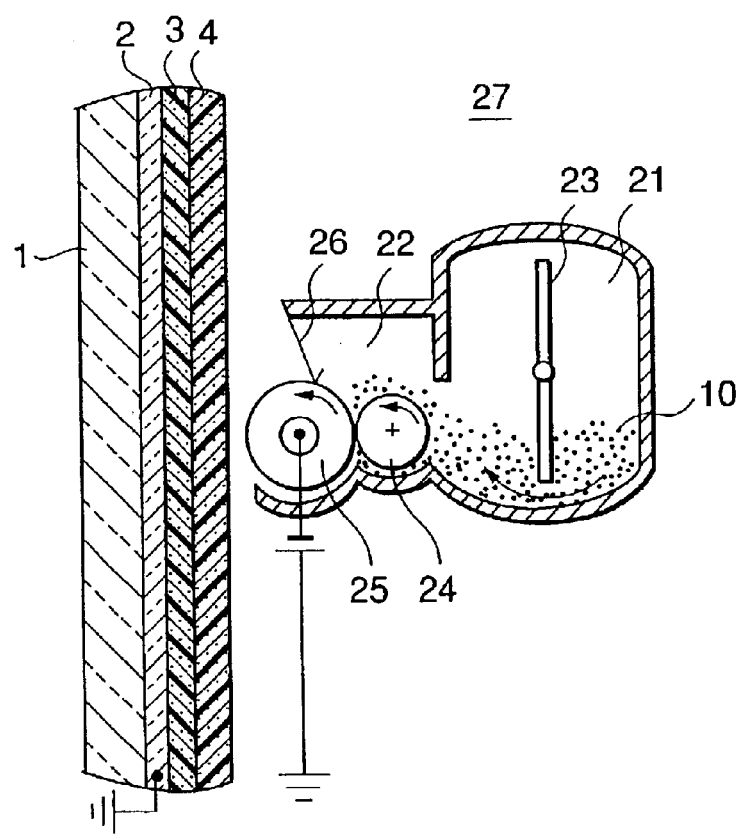
FIG. 5 is a cross-sectional view for explaining an equipment applied to the procedure shown in FIG. 3D.

Furthermore, as is shown in FIG. 3D, the electrostatic latent image 9 is developed by using a developing agent 10. The developing agent 10 that is employed is a powder composed of particles having an appropriate diameter that are produced by pulverizing a binder resin, such as polyester, styrene-acrylic copolymer or acryl, into which a charge control agent (CCA) has been kneaded. FIG. 5 is a diagram showing a developer 27 for uniformly charging the developing agent 10 and for developing an image by using the developing agent 10. As is shown in FIG. 5, the developer 27 includes a hopper 21, in which the developing agent 10 is retained; and a developing chamber 22, in which are performed the charging of the developing agent 10 and the development of the organic layer on which the electrostatic latent image 9 is formed. The developing agent 10 in the hopper 21 is stirred by an agitation member 23, and is transmitted, by a rotating (counterclockwise in FIG. 5) development agent feeding member 24, to a development agent bearing member 25 that is made of magneto-roller or elastic rubber and that is rotated counterclockwise. The developing agent 10 that is supplied to the developing agent bearing member 25 is smoothed by a thin layer formation member 26 to provide a uniformly thin layer consisting of several layers. The thin film formation member 26 is constructed by using a polymer material, such as silicone or urethane, or a thin metal plate, such as a stainless steel plate. As the developing agent bearing member 25 is rotated, the thin layer of developing agent 10, throughout which the charge control agent is dispersed, is transported to the portion whereat the bearing member 25 and the organic layer face each other. Then, by utilizing an electric field based on the difference between the surface potential Vo and the latent image potential Vi of the charge transport layer 4 and the developing bias potential Vb, which is applied to the developing member 25, the developing agent 10 is conveyed to a portion of the electrostatic latent image 9 on the surface of the charge transport layer 4, and an image is formed (see FIG. 3D). The developing agent bearing member 25 and the charge transport layer 4 may contact each other, but if these layers are slightly separated, the developing agent 10 is drawn to the charge transport layer 4 by the electric field. The development process can be performed even when the two layers are separated by a distance of 100 to 300 $\mu$m, and when it is performed while the developing agent bearing member 25 and the charge transport layer 4 are not in contact, fogging or the dispersal of the agent to a non-developed portion can be reduced. For the development, either of two processes may be employed: a positive development method, used when the potential of the charge on the charge transport layer 4 and the polarity of the charged developing agent are different, and an inverted development method, used when the potential of the charge transport layer 4 and the charged polarity of the developing agent are the same.

Figure 3E:
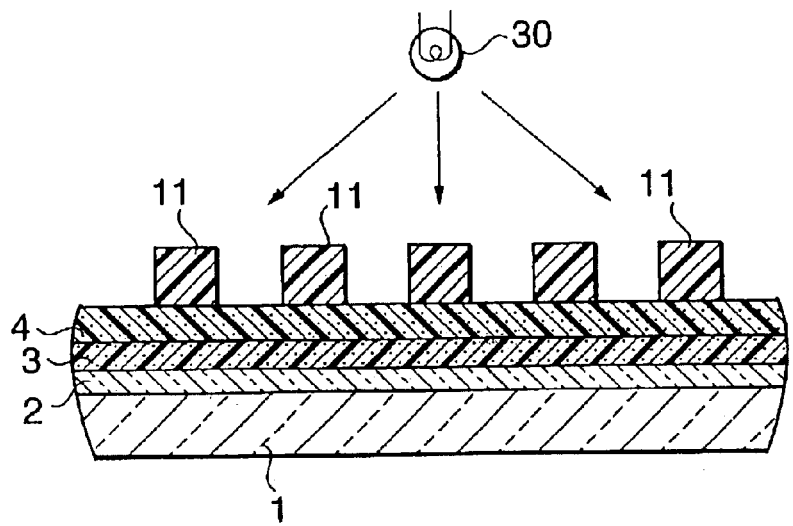
Figure 6:
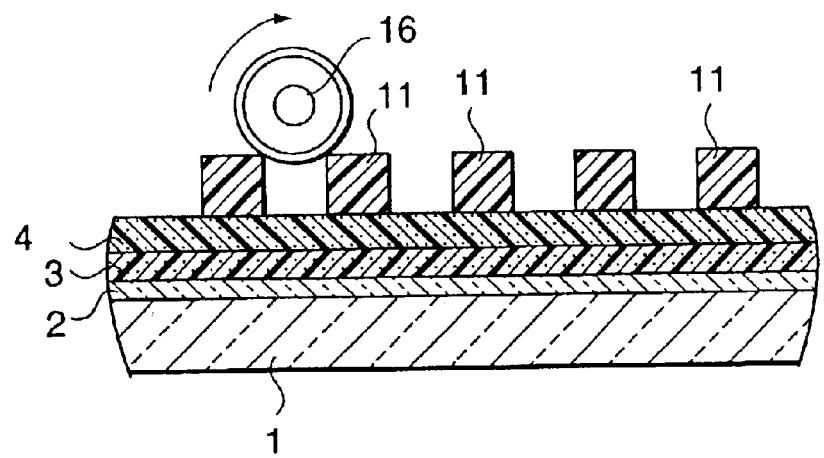
FIG. 6 is a cross-sectional view for explaining a replacement procedure for the one shown in FIG. 3E.

In addition, as is shown in FIG. 3E, after the image has been developed by transferring the developing agent 10 to the electrostatic latent image 9 on the charge transfer layer 4, the image is fixed to the surface of the charge transfer layer 4 by a fixing unit 30, for which a xenon flash lamp is provided. The fixing unit 30 fixes the developer 10 to the charge transfer layer 4 and the partitions 11 are formed without the fixing unit 30 having to contact the charge transfer layer 4. Or, after the electrostatic latent image 9 has been developed by using the developing agent 10, as is shown in FIG. 6, the obtained image may be fixed to the surface of the charge transfer layer 4 by using a heat roller 16 that is provided by coating the external surface of an aluminum tube, in which a halogen lamp is located, with a parting material, a fluoride compound, for example, such as polytetrafluoroethylene (PTFE) or polyvinylidene fluoride (PVDF). While the fixing temperature differs depending on the type of the binder resin used for the developing agent, it is normally 100 to 140° C. Since in accordance with an application and a purpose, an arbitrarily shaped electrostatic latent image can be formed, the development process using the electrostatic latent image 9 can cope with a display panel having any shape and having any type of array for sub-pixels.

Figure 3F:
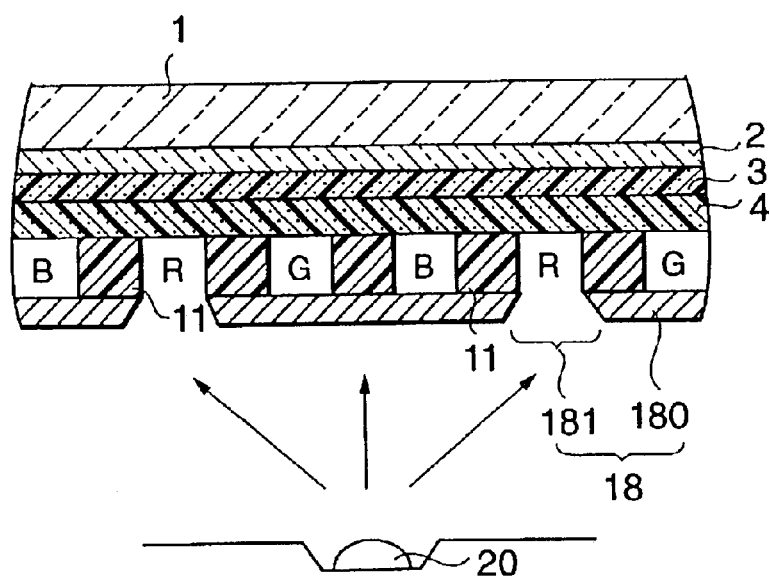

Following this, as is shown in FIG. 3F, a shadow mask 18 is disposed perpendicular to the direction in which the anode electrodes 2 are extended. Then, the emission layer 12 and the electron transport layer 13, which are composed of organic materials, and the second electrodes 14, which are cathodes, are formed in the named order by vacuum deposition. The shadow mask 18 is constructed of metal plated with SUS or with copper nickel, and includes a plurality of mask stripes 180, between which are located etched portions (mask holes) 181. When a shadow mask is used for the color, organic EL panel, generally, etching is performed for a sub-pixel width (the width of the etched hole 181) of 60 to 100 $\mu$m for one color, at intervals of 150 to 250 $\mu$m, which is the total width of the sub-pixel and the space occupied for two colors. For a shadow mask for a single-color dot panel, the width of the mask stripes 180 is 200 to 300 $\mu$m, and the width of the etched portion (mask hole) 181 is 15 to 30 $\mu$m.

Figure 3G:
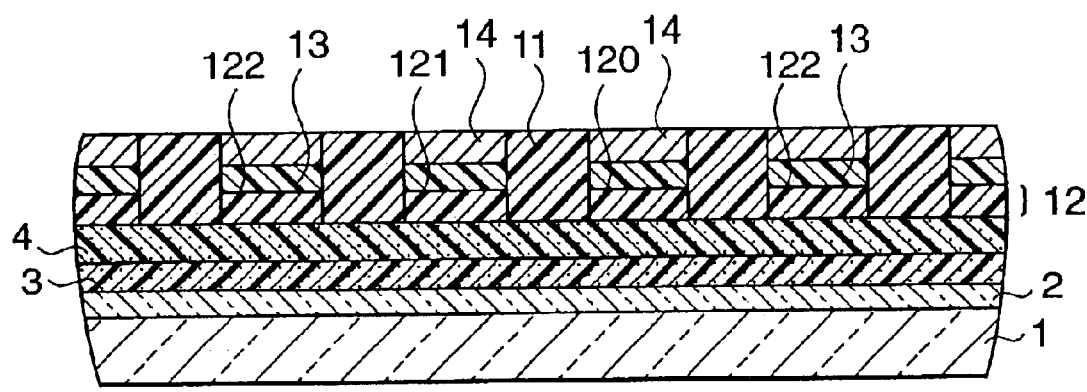

For example, when the red emission layer 120, the green emission layer 121 and the blue emission layer 122 are to be formed, the shadow mask 18 is placed on the partitions 11, so that the etching portions (mask holes) 181 of the shadow mask 18 are positioned on one color sub-pixels, e.g., red pixels (see FIG. 3F). As is shown in FIG. 3G, the red emission layers 120, the electron transport layers (ETL) 13 and the cathode electrodes 14 are formed in the named order. Then, the shadow mask 18 is shifted one sub-pixel (one color), and the green emission layers 121, the electron transport layers (ETL) 13 and the cathode electrodes 14 are deposited in the named order. Finally, the mask is again shifted one sub-pixel, and the blue emission layers 122, the electron transport layers (ETL) 13 and the cathode electrodes 14 are deposited in the named order. The emission layer 12 and the electron transport layer 13 are formed by using the above described three-color materials. The cathode electrode 14 is provided by performing vacuum deposition with Mg:Ag or Al:Li using the alloy or co-deposition method. Through the above described processing, an organic EL panel can be obtained wherein the emission pattern and the cathode are separated by the partitions 11. According to this method, when compared with the conventional method for which a sliding mask is used for vacuum deposition, the distance between the shadow mask 18 and the substrate 1 is constant, so that the occurrence of such physical pixel defects as scratches, which are caused by the mask contacting the substrate, can be reduced. Furthermore, since the possibility of short-circuiting between the respective pixels and the extension of a material to the undesirable area caused by the distortion or the positional shifting of a mask can be suppressed, neither the color shifting nor the positional shifting occurs, and a panel having sharp edges can be produced. In addition, insufficient separation does not occur, and therefore, high precision can be obtained for the sizing and the positioning. Moreover, since the partitions 11 can be used as guides during the vacuum deposition process, it is easy to align a mask and the labor requirements for the manufacturing process can be reduced.

Figure 7:
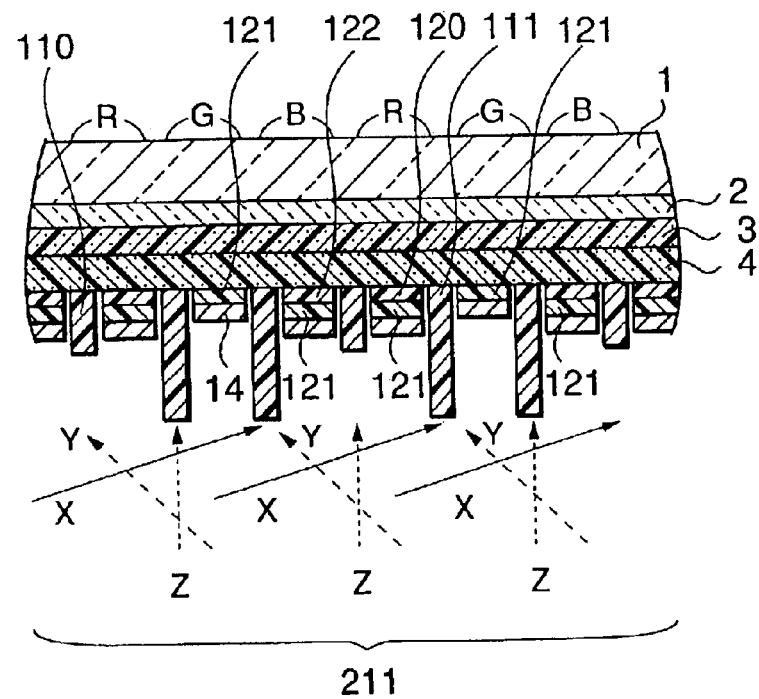
FIG. 7 is a cross-sectional view for explaining a replacement procedure for the one shown in FIG. 3F.

Furthermore, the emission layer 12, the electron transport layer 13 and the cathode electrode 14 can be formed by using the oblique deposition procedure shown in FIG. 7, instead of the vacuum deposition method employed in the procedure in FIG. 3F. When these layers are to be formed by using oblique deposition, the separation partitions 11 are employed as the shadow mask 18, and the substrate 1 is arranged at a specific angle relative to a deposition source. Then, the deposition process is performed so that evaporation streams 211 enter the substrate 1 obliquely, and color separation and cathode separation are performed. In this case, the process for the deposition of the charge generation layer 3 and the charge transfer layer 4 on the transparent electrode 2, and for uniformly charging the surface of the charge transfer layer 4 using a charger is basically performed in the same manner as for the method for which the shadow mask was used. Then, the desired portions that will serve as partitions 11 in the following process are selectively exposed by using a semiconductor laser, so that the portions are perpendicular to the ITO transparent electrode pattern. As a result, the electrostatic latent image 9 is formed.

When the heights of the partitions are made different as shown in FIG. 7, it is easy to separate the three colors, R, G and B. To change the height of each partition, the exposure amount may be altered to obtain a different exposure potential Vi. Or, an exposure duty with which a low partition is exposed is reduced, or a developing bias may be changed in order to vary the development efficiency of the developing agent 10. Furthermore, the above mentioned methods may be employed together to form partitions. In this embodiment, low partitions 110 are formed so that there is one on each side of a set of RGB pixels, and high partitions 111 are formed so that there is one between each two colors in a set (between sub-pixels R and G or G and B). The height of a partition is determined in accordance with the angle at which an evaporation stream enters a material. However, if the partitions are too low, the incident angle is small, the film thickness is uneven and the color edges are not sharply defined. As a result, a color mixture tends to occur. If the partition is too high, however, control of the evaporation stream is difficult. While taking these problems into consideration, it is preferable that the ratio of the sub-pixel width to the height of the partition be set at 0.5 to 10.

When color separation is performed by oblique deposition using partitions, the partitions are formed by performing the developing process using a developing agent to which magnetic powder has been added. Then, the magnetic force can be used to more precisely control the width and the thickness of the developing agent 10, so that the image quality can be enhanced. The thus obtained partitions, which have different heights, are employed as a shadow mask when the deposition is performed. Either a red or a blue emission material described above is formed between a low partition 110 and a high partition 111 by oblique deposition (e.g., in the direction indicated by arrows X), while a specific angle is maintained between the substrate on which the transparent electrode is mounted and the deposition source. Then, the other emission material that has not yet been deposited is formed between the low partition 110 and the high partition 111 by oblique deposition in the opposite direction (e.g., in the direction indicated by arrows Y), while a specific angle is maintained between the substrate on which the transparent electrode is mounted and the deposition source. Finally, the green emission material is deposited. In this case, if an electron transport green material, such as tris(8-quinolinol) aluminum, is employed, the green emission layer 121 can serve as an electron transport layer relative to the red emission layer 120 and the blue emission layer 122. Therefore, the green emission material is uniformly deposited on the substrate on which the red emission material and the blue emission material have been deposited. Finally, as previously described, the cathodes composed of Al:Li are uniformly formed.

Figure 8:
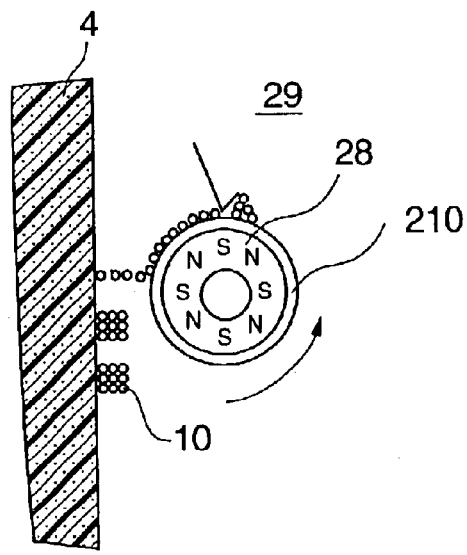
FIG. 8 is a cross-sectional view for explaining a replaceable equipment for the one shown in FIG. 5.

Furthermore, the developing agent 10 used in the procedure in FIG. 3D may be obtained by kneading magnetic powder, for example, magnetite or ferrite, such as $Fe_3O_4$, $MnO \cdot Fe_2O_3$ or $ZnO \cdot Fe_2O_3$, into a binder resin. Then, when the developing process is performed by using the developing agent 10 containing the magnetic powder, a magnetized roller that is internally provided for the heat roller is employed, or a magnet is located near the charge transfer layer 4 when the flash lamp is employed to attract the developing agent. Thus, the feature size of the partition 11 can be reduced, and the height of the partitions 11 can be adjusted. When the magnetized roller is employed, the developing bearing member 25 in the developer 27 in FIG. 5 is replaced by a magnetized roller 28 as is shown in FIG. 8. As the magnetized roller 28 is rotated, the developing process is performed by a developer 29 that feeds the developing agent containing the magnetic powder to the surface of the charge transfer layer 4. In this case, when the magnet of the magnetized roller 28 is brought close to the developing agent 10, the width and the thickness of the developing agent 10 can be controlled more precisely. Since the magnetic powder is known to be a black coloring pigment, black partitions 11 can be formed by using the developing agent 10 that is obtained by adding the magnetic powder to the binder resin, so that the contrast for a displayed image can be improved. Instead of the magnetic powder, a small amount of a black material, such as furnace black, channel black, acetylene black or ketene black may be kneaded into the resin to provide black partitions.

For the thus obtained organic EL panel of the present invention, it is preferable that the width of a partition 11 be 10 to 40 μm, i.e., that the distance between adjacent emission layers be 10 to 40 μm. When the width of a partition 11 is narrower than 10 μm, the emission layer 12 is not sufficiently separated, and the image quality may be deteriorated. When the width of the partition 11 is wider than 40 μm, however, the aperture ratio is reduced, and it is difficult to provide a smaller feature size for a pixel. As for the organic EL panel of the invention, however, since the width of a partition 11 is 10 to 40 μm, i.e., the interval between the adjacent emission layers is 10 to 40 μm, the emission layer can be completely separated, and the aperture ratio can be increased, so that a fine display panel with pixels of a smaller feature size can be obtained. Furthermore, according to the method used to manufacture the organic EL panel of the invention, separation for each color, pattern formation and cathode separation can be easily performed. Also, since a dry process is employed for these manufacturing procedures, the generation and the growth of dark spots can be prevented, and the productivity can be improved.

As a method to be used for depositing an emission layer for an organic EL panel, according to a technique is disclosed in Japanese Unexamined Patent Publication No. Hei 11-126687, a charge generation layer is selectively exposed, and an electrostatic latent image formed on a charge transfer layer is developed to form a light emission pattern. This publication, however, is for an EL panel that does not have partitions, and there is no description in the publication of a method that can be used for manufacturing the organic EL panel of this invention, which has partitions. The only point with which this publication and this invention share exists in employing an electrostatic latent image.

The preferred embodiments for the organic EL panel of this invention and the method used for the manufacture of the organic EL panel will now be described while referring to the drawings.

(Embodiment 1)

Figure 9:
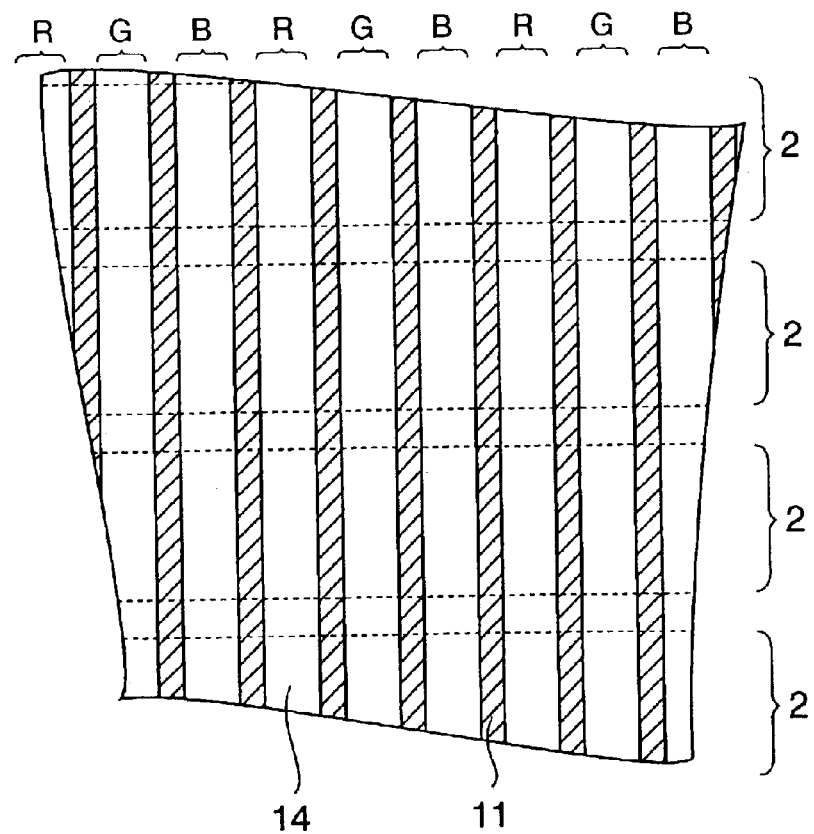
FIG. 9 is a plan view of a plane pattern for a transparent electrode, for partitions and for an emission layer formed on an organic EL panel according to a first embodiment of the present invention.

As the first embodiment of the present invention, a color organic EL panel and a manufacturing method thereof will be described. As is shown in the plan view in FIG. 9, a 130 nm thick ITO film was deposited by sputtering on a 1.1 mm thick glass substrate 1, on which a plurality of transparent electrodes 2 were formed as stripes by using such processes as lithography and wet etching. The sheet resistance of the transparent electrode 2 was 12 $\Omega/cm^2$, the line width was 240 µm and the space was 20 µm. Then, metal-free phthalocyanine and butyral resin were weighed at a weight ratio of 3.0:1, and were dissolved in THF and dispersed by mixing them. As a result, a dispersed coating liquid having a solid content of 3 wt % was obtained. Spin coating was then used to coat the transparent electrodes 2 with the dispersed coating liquid, and a charge generation layer 3 of 150 nm was deposited. Following this, N,N'-diphenyl-N,N'-bis(α-naphthyl)-1,1'-biphenyl-4,4'-diamine (α-NPD) and polycarbonate were weighed at a weight ratio of 2.5:1, and were dissolved in dichloromethane, thereby providing a dispersed coating liquid having a solid content of 2 wt %. Spin coating was then used to coat the charge generation layer 3 with the dispersed coating liquid and a charge transfer layer 4 was deposited thereon with a thickness of 200 nm (see FIG. 3A). As is shown in FIG. 3B, the glass substrate 1 on which the organic layers (the charge generation layer 3 and the charge transfer layer 4) were formed was charged by using scorotron to have a surface potential of Vo=−400 V. The voltage applied to the scorotron wire was about DC−3 KV, the constant control current was 500 µA, and the grid voltage was Vg=−400 V. Then, in order to perform inverted development, as is shown in FIG. 3C, a semiconductor laser 8 was employed to selectively expose the portions (see 11 in FIG. 9) that were related to the grooves between cathode electrodes that were to be formed during the following procedure, so that the portions were perpendicular to the striped wiring pattern of the transparent electrodes 2. The exposure amount was 0.3 mW/cm$^2$, the exposure spot diameter was 10 µm. And as a result, an electrostatic latent image 9 (see FIG. 3D) was formed at the surface potential Vo=−400 V of the charge transfer layer 4 and at the exposure potential Vi=−40 V.

Following this, as is shown in FIG. 3D, polyester resin, which was obtained by kneading into the resin 7% of channel black, which is a black coloring material, and 2% of a charging control agent that contains a monoazo dye metal complex, which is an electron reception acceptor, was pulverized to obtain particles having a centroid diameter of 4 µm. Thus, the developing agent was obtained, and an average charging amount of−11 µC/g was obtained. The development was performed by applying a developing bias Vb=−150 V to the developing agent 10 then to attach a developing agent 10 to the partition portion (exposed portion). Then, as is shown in FIG. 3E, a non-contact means, a xenon flash lamp 30, was used to fix the developing agent 10 at a temperature of 120° C. and to complete the formation of the partitions 11. Next, as is shown in FIG. 3F, a shadow mask 18 was placed on the partitions 11 so that the mask holes 181 were aligned with the locations for the red emission layer portions (R in FIG. 9). As for the procedures used to deposit the red emission layers 120, tris(8-quinolinol)aluminum and, as a dopant, 4-dicyanomethylene-2-methyl-6-(p-dimethylaminostyryl)-4H-pyrane (DCM, a doping density of 2.5 wt %) were co-deposited on the charge transfer layer 4 to have a thickness of 35 nm. Then, to form the electron transport layers 13, Alq3 was deposited on the red emission layers 120 to have a thickness of 35 nm. And finally, on the electron transport layer 13, Al:Li was co-deposited on the electron transport layers 13 to have a thickness of 30 nm, and thereon aluminum layer was deposited to have a thickness of 150 nm to form the cathode electrodes 14. For the green emission layers 121, the shadow mask 18 was shifted so that the mask holes 181 were aligned with the portions whereat the green emission layers were to be formed. And the green emission layer 121, the electron transport layer 13 and the cathode electrode 14 were formed by deposition in the same manner as were the red emission layers 120. Specifically, tris(8-quinolinol)aluminum, as a host, and 2,9-dimethylquinacridone (doping density of 3 wt %), as a dopant, were co-deposited on the charge transfer layer 4 to have a thickness of 35 nm to form the green emission layer 121. Then, the electron transport layer 13 was formed by depositing tris(8-quinolinol)aluminum on the green emission layer 121 to have a thickness of 35 nm, following which Al:Li was co-deposited on the electron transport layer 13 to have a thickness of 30 nm whereon aluminum was deposited to have a thickness of 150 nm to form the cathode electrode 14. Similarly, for the blue emission layers 122, the shadow mask 18 was shifted to align the mask holes 181 with the portions whereat the blue emission layers were to be formed. And the blue emission layers 122, the electron transport layers 13 and the cathode electrodes 14 were formed by deposition in the same manner as were the red emission layers 120. Specifically, 4,4'-bis(2,2-diphenylvinyl)biphenyl was deposited on the charge transfer layer 4 to have a thickness of 35 nm, and the same materials as were used for the red and green emission layers were employed to form the electron transport layers 13 and the cathode electrodes 14. As a result, an organic EL panel was obtained that provided a color display of 270×270 µm for one pixel, 70 µm for a sub-pixel, 20 µm for space and 320 horizontal×240 vertical dots (see FIG. 3G). Since the developing agent that contained the black coloring material was employed for the organic EL panel, the partitions were black, and the contrast was 80:1 under 300 Lux.

(Embodiment 2)

Figure 10:
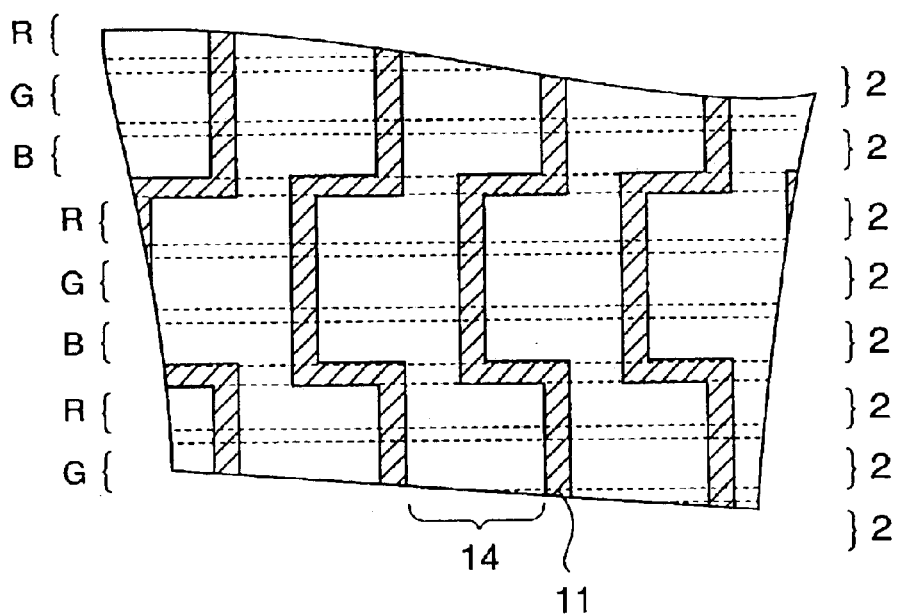
FIG. 10 is a plan view of a plane pattern for a transparent electrode, for partitions and for an emission layer formed on an organic EL panel according to a second embodiment of the present invention.

An explanation will now be given for an organic EL panel and a manufacturing method thereof according to the second embodiment of the present invention. As is shown in the plan view in FIG. 10, an ITO film 130 nm thick was deposited by sputtering on a 1.1 mm thick glass substrate 1, on which transparent electrodes 2 were formed as stripes by using lithography and wet etching. The sheet resistance of each transparent electrode 2 was 12 Ω/cm$^2$, and unlike the first embodiment, the wiring width for the transparent electrodes 2 was 70 µm, and the space between the transparent electrodes 2 was set at 15 µm in order that the RGB colors could be painted separately on the transparent electrodes 2. Then, copper phthalocyanine and butyral resin were weighed at a weight ratio of 3.0:1, and were dissolved in THF and dispersed by mixing them. As a result, a dispersed coating liquid having a solid content of 3 wt % was obtained. Spin coating was then used to coat the transparent electrodes 2 with the dispersed coating liquid, and a charge generation layer 3 of 150 nm was formed. Next, N,N'-diphenyl-N,N'-bis(α-naphthyl)-1,1'-biphenyl-4,4'-diamine and polycarbonate were weighed at a weight ratio of 2.5:1, and were dissolved in dichloromethane. As a result, a dispersed coating liquid having a solid content of 2 wt % was obtained. Spin coating was then used to coat the charge generation layer 3 with the dispersed coating liquid, so that a charge transfer layer 4 of 200 nm was deposited (see FIG. 3A). As is shown in FIG. 3B, the glass substrate 1 on which the organic layers (the charge generation layer 3 and the charge transfer layer 4) were formed was charged by using scorotron and had a surface potential of Vo=−400 V. The voltage applied to the scorotron wire was about DC −3 KV, the constant control current was 500 µA, and the grid voltage was Vg=−400 V. Then, in order to perform inverted development, as is shown in FIG. 3C, in order to form partitions having a desired shape that were perpendicular to the striped wiring pattern of the transparent electrodes 2, a semiconductor laser 8 was employed to selectively expose the charge generation layer 3. The partitions were also shaped like a crank, so that individual pixels had the shape shown in the plan view in FIG. 10. The wavelength of an exposure unit, the exposure amount and the exposure spot diameter are the same as those for the first embodiment. As a result, an electrostatic latent image 9 (see FIG. 3D) was formed at the surface potential Vo=−400 V of the charge transfer layer 4 and the exposure potential Vi=−50 V.

Figure 11:
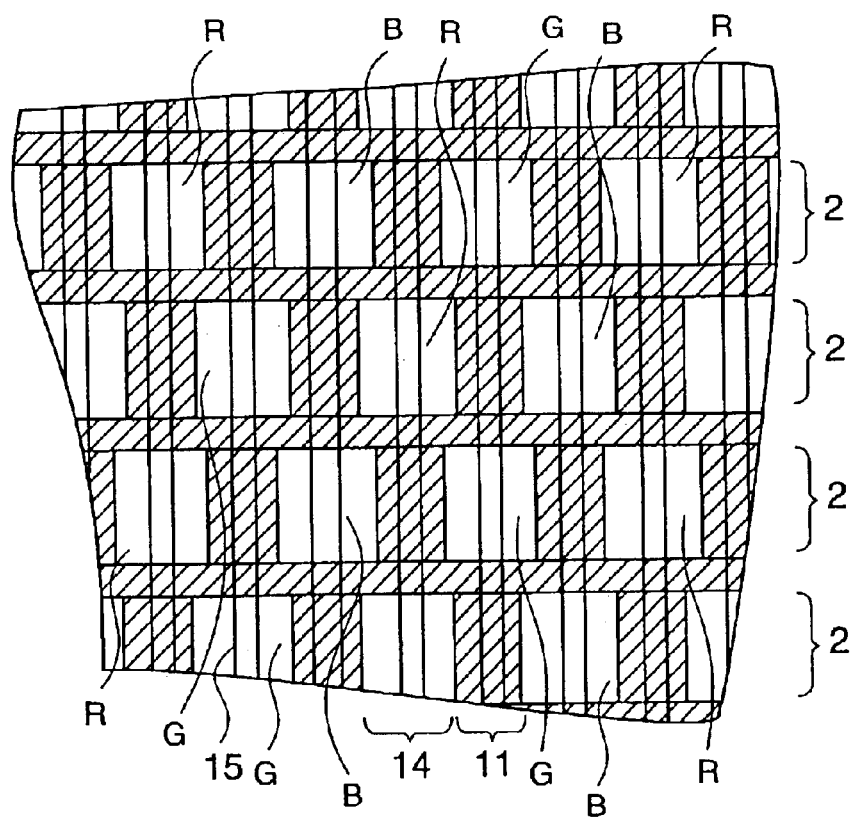
FIG. 11 is a plan view of a plane pattern for a transparent electrode, for partitions and for an emission layer formed on a modified organic EL panel according to the second embodiment of the present invention.

Following this, polyester resin, which was prepared by kneading in 7% of channel black, which is black coloring material, and 2% of a charging control agent that contains a monoazo dye metal complex, which is an electron reception acceptor, was pulverized to obtain particles having with a centroid diameter of 4 $\mu$m. In this fashion, a developing agent 10 having an average charging amount of −11 $\mu$C/g was obtained. As is shown in FIG. 3D, the development was performed by applying a developing bias Vb=−150 V to the developing agent 10, and the developing agent 10 was attached to the partition portion (the exposed portion). Then, as is shown in FIG. 3E, a non-contact means, a xenon flash lamp 30, was used to fix the developing agent 10 at a temperature of 120° C. and to complete the formation of the partitions 11. The height of the partitions 11 was 7 $\mu$m. Next, as is shown in FIG. 3F, a shadow mask 18 was placed on the partitions 11, so that mask holes 181 were aligned with the locations for the red emission layer portions (on the wiring pattern of the transparent electrodes 2). As is shown in FIG. 3G, to deposit the red emission layers 120, tris(8-quinolinol) aluminum (Alq3), as a host, and 4-dicyanomethylene-2-methyl-6-(p-dimethylaminostyryl)-4H-pyrane (DCM, the doping density of 2.5 wt %), as a dopant, were co-deposited on the charge transfer layer 4 to have a thickness of 35 nm. And, tris(8-quinolinol)aluminum was deposited on the red emission layers 120 to have a thickness of 35 nm to form an electron transport layer 13. For the green emission layers 121, the shadow mask 18 was shifted to align the mask holes 181 with the portions whereat the green emission layers were to be formed. And the green emission layers 121 and the electron transport layers 13 were formed by deposition in the same manner as were the red emission layers 120. Specifically, tris(8-quinolinol)aluminum, as a host, and 2,9-dimethylquinacridone (doping density of 3 wt %), as a dopant, were co-deposited on the charge transfer layer 4 to have a thickness of 35 nm to form the green emission layers 121. Then, the electron transport layer 13 was formed by depositing tris(8-quinolinol)aluminum on the green emission layers 121 to have a thickness of 35 nm. Similarly, as for a blue emission layers 122, the shadow mask 18 was shifted to align the mask holes 181 with the portions whereat the blue emission layers were to be formed. And the blue emission layers 122 and the electron transport layers 13 were formed by deposition in the same manner as were the red emission layers 120. Specifically, 4,4'bis(2,2-diphenylvinyl)biphenyl was deposited on the charge transfer layer 4 to have a thickness of 35 nm, and the same materials as were used for the red and green emission layers were employed to form the electron transport layers 13. Finally, as a cathode electrode 14, Al:Li was co-deposited on each emission layer to have a thickness of 30 nm, and on this aluminum was deposited with a thickness of 100 nm to form cathode electrodes 14. At this time, even without using the shadow mask 18 the cathode electrodes 14 were seperately deposited on each emission layer because of the big height difference which is caused by the partitions 11. Therefore, a cathode electrode pattern could be easily obtained without short-circuiting the cathode electrodes 14. Through these procedures, an organic EL panel was obtained that provided a color display of 270×270 $\mu$m for one pixel, 70 $\mu$m for a sub-pixel, 20 $\mu$m for space and 320 horizontal×240 vertical dots. The contrast was 90:1 under 300 Lux. According to this method, exposure can be performed with a great degree of freedom, and partitions having complicated patterns can be arbitrarily prepared in accordance with an application or a purpose. Therefore, it is also possible to obtain an organic EL panel wherein, as is shown in the plan view in FIG. 11, RGB are arranged in a delta array by using bus electrodes 15 that connect cathodes 14 that are arranged like a checkerboard.

(Embodiment 3)

An explanation will now be given for an organic EL panel and a manufacturing method thereof according to the third embodiment of the present invention. An ITO film 130 nm thick was deposited by sputtering on a 1.1 mm thick glass substrate 1, on which transparent electrodes 2 were formed as stripes by using lithography and wet etching. The sheet resistance of each transparent electrode 2 was 15 $\Omega/cm^2$, the wiring width was 250 $\mu$m, and the space was 20 $\mu$m. Then, metal-free phthalocyanine and butyral resin were weighed at a weight ratio of 3.0:1, and were dissolved in THF and dispersed by mixing them. As a result, a dispersed coating liquid having a solid content of 3 wt % was obtained. Spin coating was then used to coat the transparent electrodes 2 were coated with the dispersed coating liquid, and a 150 nm charge generation layer 3 was formed. Next, N,N'-diphenyl-N,N'-bis($\alpha$-naphthyl)-1,1'-biphenyl-4,4'diamine and polycarbonate were weighed at a weight ratio of 2.5:1, and were dissolved in dichloromethane. As a result, a dispersed coating liquid having a solid content of 2 wt % was obtained. Spin coating was then used to coat the charge generation layer 3 with the dispersed coating liquid, and in this manner, a 200 nm charge transfer layer 4 was deposited (see FIG. 3A). As is shown in FIG. 3B, the glass substrate 1 on which the organic layers (the charge generation layer 3 and the charge transfer layer 4) were formed was charged by using scorotron 5 to have a surface potential of Vo=−400 V on the charge transfer layer 4. The voltage applied to the scorotron wire was about DC −3 KV, the constant control current was 500 $\mu$A, and the grid voltage was Vg=−400 V. Then, as is shown in FIG. 3C, a semiconductor laser 8 was employed to selectively expose the portions of the charge generation layer 3 whereat emission layers were to be formed during the following process, so that the portions would be perpendicular to the wiring pattern of the transparent electrodes 2 (positive developing). The wavelength of an exposure unit, the exposure amount and the exposure spot diameter were the same as those used for the first embodiment. The exposure amount was 0.3 mW/cm$^2$ and 0.1 mW/cm$^2$. As a result, an electrostatic latent image 9 was formed at a surface potential of Vo=−400 V on the charge transfer layer 4 and at an exposure potential of Vi=−40 V when the exposure amount was 0.3 mW/cm$^2$, and of Vi=−100 V when the exposure amount was 0.1 mW/cm$^2$.

Following this, a developing agent, which was obtained by kneading in 8% of channel black, which is black coloring material, 17% of magnetic powder Fe$_3$O$_4$ and 2% of quaternary ammonium salt, which is a positive charge control agent, was pulverized to obtain particles having a centroid diameter of 4 $\mu$m. In this manner, the developing agent having an average charging amount of 10 $\mu$C/g were obtained. By the application of a developing bias Vb=−200 V to the developing agent, the development was performed by using this spheroidal developing agent, and the developing agent was attached to the partition portion (exposed portion). Then, as is shown in FIG. 6, the developing agent was fixed by using a heat roller 16 provided by applying polytetrafluoroethylene (PTFE) to the external surface of a magnetized roller for which a halogen lamp was is internally provided. Partitions 11 were thus obtained. The heights of the partitions 11 were 3 µm and 45 µm, and their width was 8 µm. The fixing temperature used this styrene-acrylic copolymer was 120° C. at a fixing process. speed of 30 mm/sec. For a red emission layer 120, tris(8-quinolinol) aluminum, as a host, and 4-dicyanomethylene-2-methyl-6-(p-dimethylaminostyryl)-4H-pyrane (DCM, the doping density of 3 wt %), as a dopant, were co-deposited on the charge transfer layer 4 to have a thickness of 30 nm. At this time, as is shown in FIG. 7, while the glass substrate 1 was positioned at a specific angle relative to the deposition source, oblique deposition was performed so that deposition streams entered the glass substrate 1 obliquely, as is indicated by arrows X. Then, deposition of the blue emission material was performed. For this process, the glass substrate 1 and the deposition source were arranged in the opposite direction to the one that was used for the red deposition process, so that the deposition streams entered the glass substrate in the direction opposite to the one at which they enter during the red deposition process, i.e., in the direction indicated by arrows Y. Then, diphenylvinyl biphenyl was deposited on the charge transfer layer 4 to have a thickness of 30 nm to form a blue emission layer 122. Next, a green emission material was deposited. For this process, tris(8-quinolinol)aluminum was employed. In this case, since the green emission layer serves as the electron transport layer for the emission layers of the other two colors, the deposition source was placed immediately below the center of the glass substrate 1, and tris(8-quinolinol)aluminum was deposited on all other emission layers to have a thickness of 40 nm. In this manner, a green emission layer 121 was formed. Finally, Al:Li was co-deposited on the green emission layer 121 to have a thickness of 30 nm and on this aluminum was deposited with a thickness of 100 nm without using a shadow mask to form the cathode electrodes 14. The cathode electrodes 14 were separated, as individual colors, by the partitions 110 and the partitions 111. Through these procedures, an organic EL panel was obtained that provides a color display of 270×270 µm for one pixel, 70 µm for a sub-pixel, 25 µm for space and 320 horizontal×240 vertical dots. The contrast was 100:1 under 300 Lux.

(Embodiment 4)

An explanation will now be given for an organic EL panel for green emissions only and a manufacturing method thereof, according to the fourth embodiment of the present invention. A 150 nm ITO film was deposited by sputtering on a 0.7 mm thick glass substrate 1, and transparent electrodes 2 that served as anodes were formed by using lithography and wet etching. The sheet resistance of each transparent electrode 2 was 10 Ω/cm², the wiring width was 300 µm, and the space was 30 µm. Then, copper phthalocyanine and butyral resin were weighed at a weight ratio of 3.0:1, and were dissolved in THF and dispersed by mixing them. As a result, a dispersed coating liquid having a solid content of 3 wt % was obtained. Spin coating was then used to coat the transparent electrodes 2 with the dispersed coating liquid, and the coat was dried, so that a 150 nm charge generation layer 3 (hole injection layer) was formed. Next, N,N'-diphenyl-N,N'-di(3-methylphenyl)-1,1'-biphenyl-4,4'-diamine and polycarbonate were weighed at a weight ratio of 2.5:1, and were dissolved in dichloromethane. As a result, a dispersed coating liquid having a solid content of 2 wt % was obtained. Spin coating was then used to coat the charge generation layer with the dispersed coating liquid, so that a 200 nm charge transfer layer 4 was deposited (see FIG. 3A). As is shown in FIG. 4, the glass substrate 1 on which the organic layers (the charge generation layer 3 and the charge transfer layer 4) were formed was charged by a contact charger that employed the charging roller 6. The voltage applied to the charging roller 6 was about −600 V, and the surface potential Vo of the charge transfer layer 4 under constant voltage control was −400 V. Then, as is shown in FIG. 3C, a semiconductor laser 8 was employed to selectively expose the portions other than the grooves between the cathode electrodes that were to be formed in the following process, i.e., the desired portions whereat emission layers were to be formed during the following process, so that the portions would be perpendicular to the wiring pattern of the transparent electrodes 2. The wavelength of an exposure unit was 780 nm, which is the absorption wavelength of a charge generation agent that was contained in the charge generation layer 3. The exposure amount was 0.3 mW/cm², the exposure spot diameter was 10 µm, and the exposure width was 30 µm. As a result, an electrostatic latent image 9 was formed at the latent potential Vi=−40 V.

Figure 3H:
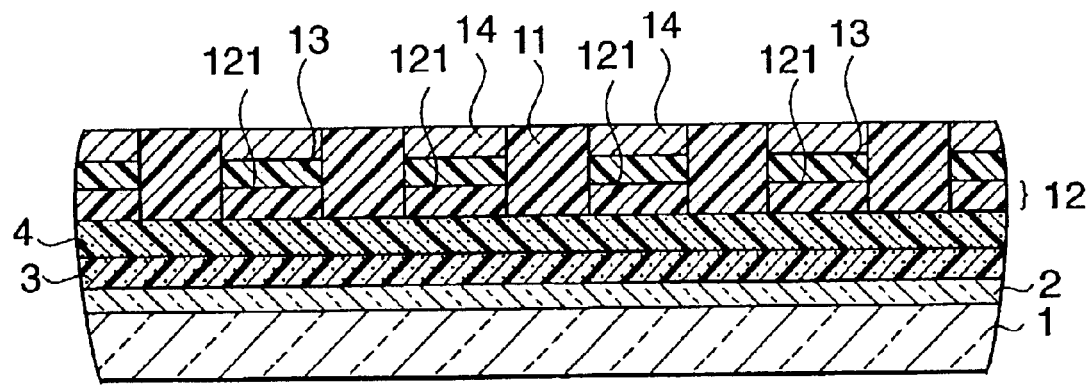

As is shown in FIG. 5, 8% of channel black, which is a black coloring material, and 2% of a nigrosine dye, which is a positive charge control agent, were mixed with styrene-acrylic copolymer, a binder resin, and pulverized, so that particles having a centroid diameter of 6 µm and an average charge amount of 8 µC/g were obtained for a spheroidal developing agent 10. By using this developing agent 10, as is shown in FIG. 3D, the developing process was performed by applying a developing bias potential Vb=−160 V to the developing roller 25. Then, as is shown in FIG. 3E, a non-contact means, a xenon flash lamp 30, was employed to fix the developing agent 10 to the charge transfer layer 4 at 120° C., so that partitions 11 were formed. Following this, as is shown in FIG. 3H, for a green emission layer 121, tris(8-hydroxyquinolinol)aluminum, as a host, and quinacridone, as a dopant (a the doping density of 2.5 wt %), were co-deposited on the charge transfer layer 4 to have a thickness of 25 nm. Next, as an electron transport layer 13, tris(8-hydroxyquinolinol)aluminum was deposited on the green emission layer 121 to have a thickness of 30 nm. Furthermore, as a cathode electrode 14, Mg:Ag were co-deposited on the electron transport layer 13 to have thickness of 20 nm by using two sources. Through the above process, an organic EL panel, having only the green emission layer 121 and having a dot pitch of 300×300 µm, space of 30 µm and 256×64 dots was obtained. The contrast was 100:1 under 300 Lux.

COMPARISON EXAMPLE

Figure 1A:
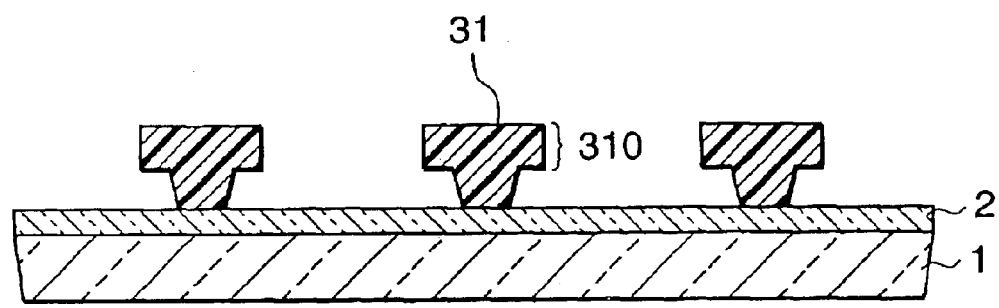
FIGS. 1A to 1D are cross-sectional views for explaining a method for manufacturing a conventional organic EL panel.
Figure 1B:
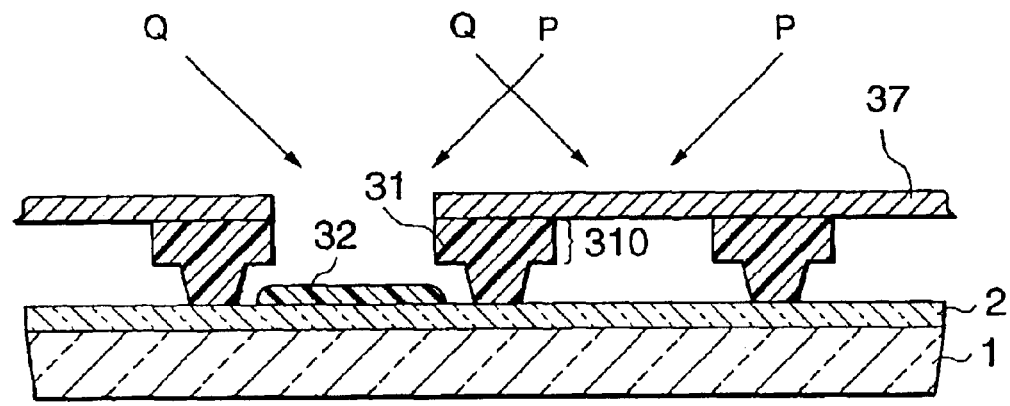
Figure 1C:
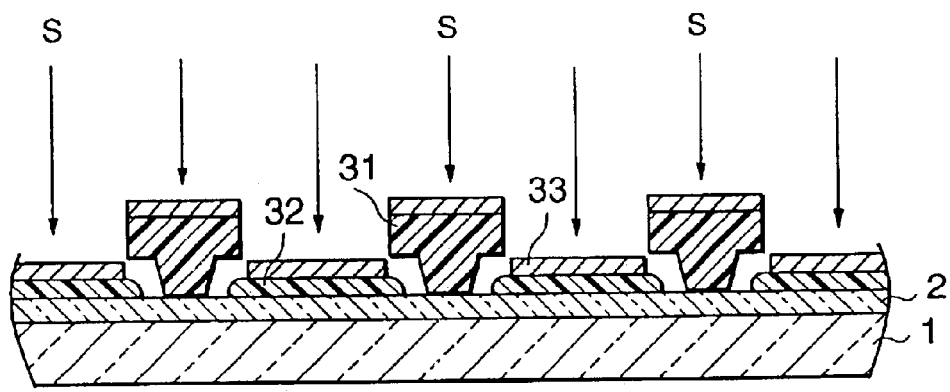
Figure 1D:
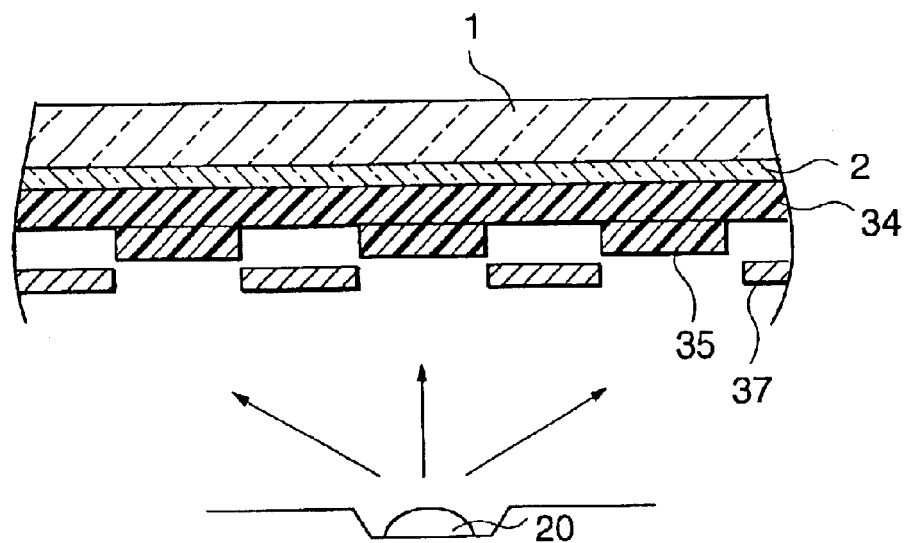

A conventional organic EL panel was manufactured, as shown in FIG. 1D, to use as a comparison with the above embodiments. An ITO thin film of 120 nm was deposited on a glass substrate 1 of 1.1 mm by sputtering, and transparent electrodes 2, which were anodes, were formed as stripes. The sheet resistance of the transparent electrodes 2 was 15 Ω/cm², the wiring width was 250 nm, and the space was 20 µm. Then, as a hole injection and transport layer, a 50 nm layer 34 of N,N'-diphenyl-N,N'-bis(α-naphthyl)-1, 1'biphenyl-4,4'-diamine of was formed on the glass substrate 1 by using vacuum deposition. Next, a shadow mask 37 was positioned on the organic layer 34, perpendicular to the transparent electrode pattern, so that mask holes were aligned with the red color areas. As a red emission material, 4-dicyanomethylene-2-methyl-6-(p-dimethylaminostyryl)-4H-pyrane of 3 wt % was doped into tris(8- hydroxyquinolinol)aluminum, and this material was deposited on the organic layer 34. Following this, as electron transport layers, tris(8-quinolinol)aluminum was deposited with a thickness of 30 nm on the emission layers. Furthermore, Al:Li was formed on the electron transport layer with a thickness of 30 nm, and aluminum were formed thereon with a thickness of 120 nm. Thus, the cathode electrodes were formed. In addition, a shadow mask was slid back and forth, and green emission layers and blue emission layers, and an electron transport layer and a cathode electrode were formed in the same manner as were the red emission layers. For the green emission layers, tris(8-quinolinol)aluminum and quinacridone were co-deposited on the organic layer 34 to have a thickness of 25 nm, so that as a dopant, 3 wt % of quinacridone was contained in the mixture. After tris(8-quinolinol)aluminum was deposited with a thickness of 30 nm on the green emission layers as the electron transport layer, Al:Li was formed by co-deposition on the electron transport layer to have a thickness of 30 nm, and aluminum were formed thereon with a thickness of 120 nm to obtain cathode electrodes. For the blue emission layers, diphenylvinyl biphenyl was deposited on the organic layer 34 to have a thickness of 30 nm. After tris(8-quinolinol)aluminum was deposited with a thickness of 30 nm on the green emission layers as the electron transport layer, Al:Li was co-deposited on the electron transport layer to have a thickness of 30 nm, and aluminum was deposited thereon with a thickness of 120 nm. The cathode electrodes were formed in this manner. To separate the RGB colors, as is shown in FIG. 1D, a shadow mask 37 was merely slid back and forth, and no partitions were present. According to this separation method, the alignment of the mask is difficult for a dot pitch of 80 $\mu$m and a space of 40 $\mu$m or both being smaller. Furthermore, the shifting of colors occurs because organic emission material is extended into the mask area of the shadow mask 37 during the deposition process. For these reasons, the manufacturing of a panel is difficult. And when the mask is brought into contact with previously prepared organic layer 34 in order to prevent the extension of the organic emission material, the mask scratches the organic layer 34, and the number of defective pixels is increased. In addition, according to this conventional method, between the cathodes there are no partitions such as those prepared for the invention that contain a black pigment, and since therefore light reflected by the cathodes can not be suppressed, the contrast was 10:1 under 300 Lux.

What is claimed is:

1. An organic EL panel comprising:

a transparent substrate;

a first electrode, composed of a transparent material, that is formed on said transparent substrate;

a charge generation layer covering said first electrode;

a charge transfer layer formed thereon; partitions formed on said charge transfer layer by using a developing agent pattern having a predetermined shape; and an emission layer and a second electrode formed between said partitions.

2. The organic EL panel according to claim 1, wherein the width of each of said partitions is 10 to 40 $\mu$m.

3. The organic EL panel according to claim 1, wherein said partitions are black.

4. The EL panel according to claim 1, wherein said charged transfer layer is made of organic material.

* * * * *